United States Patent
Nakata et al.

(10) Patent No.: US 11,174,949 B2
(45) Date of Patent: Nov. 16, 2021

(54) ACTUATOR AND VALVE DEVICE USING THE SAME

(71) Applicant: FUJIKIN INCORPORATED, Osaka (JP)

(72) Inventors: Tomohiro Nakata, Osaka (JP); Tatsuhiko Sato, Osaka (JP); Takeru Miura, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 190 days.

(21) Appl. No.: 16/519,389

(22) Filed: Jul. 23, 2019

(65) Prior Publication Data
US 2020/0041007 A1 Feb. 6, 2020

(30) Foreign Application Priority Data

Jul. 31, 2018 (JP) ............................. JP2018-143192

(51) Int. Cl.
*F16K 1/52* (2006.01)
*H01L 21/67* (2006.01)
(Continued)

(52) U.S. Cl.
CPC ............ *F16K 1/523* (2013.01); *F16K 31/122* (2013.01); *H01L 21/67017* (2013.01); *F16K 7/17* (2013.01); *F16K 31/1226* (2013.01)

(58) Field of Classification Search
CPC .... F16K 1/523; F16K 31/122; F16K 31/1225; F16K 31/1226; F16K 31/1221; F16K 7/17; H01L 21/67017
See application file for complete search history.

(56) References Cited

U.S. PATENT DOCUMENTS

| | | | | |
|---|---|---|---|---|
| 5,000,222 A | * | 3/1991 | Moenkhaus | F16L 55/02 137/15.18 |
| 5,755,428 A | * | 5/1998 | Ollivier | F16K 7/14 251/331 |

(Continued)

FOREIGN PATENT DOCUMENTS

| | | |
|---|---|---|
| JP | 2006-519971 | 8/2006 |
| JP | 2010-43714 | 2/2010 |

OTHER PUBLICATIONS

U.S. Appl. No. 16/347,934 to Toshihide Yoshida et al., filed May 7, 2019.

(Continued)

*Primary Examiner* — Craig J Price
*Assistant Examiner* — Andrew J Rost
(74) *Attorney, Agent, or Firm* — Greenblum & Bernstein, P.L.C.

(57) ABSTRACT

To provide a valve device capable of easily and precisely adjusting a flow rate of a flowing fluid, and an actuator used in the valve device. The problem is solved by an actuator including pistons housed in a housing, a supply port of compressed air provided to a casing constituting the housing, and an adjustment member that is provided to a position separated from the supply port and regulates an upper limit position of possible movement of the piston that comes into contact with the adjustment member. The piston comes into contact with the adjustment member and is positioned in the upper limit position when compressed air is supplied through the supply port. The adjustment member s provided so as to allow adjustment of the upper limit position from outside the housing.

12 Claims, 11 Drawing Sheets

(51) Int. Cl.
  *F16K 31/122* (2006.01)
  *F16K 7/17* (2006.01)

(56) References Cited

U.S. PATENT DOCUMENTS

| | | | | |
|---|---|---|---|---|
| 5,979,792 | A * | 11/1999 | Fukano | F16K 23/00 |
| | | | | 222/571 |
| 7,337,805 | B2 * | 3/2008 | Brown | F16K 7/14 |
| | | | | 137/625.33 |
| 7,823,859 | B2 * | 11/2010 | Ejiri | F16K 31/1225 |
| | | | | 251/60 |
| 7,971,599 | B2 * | 7/2011 | Aoyama | F16K 31/1225 |
| | | | | 137/270 |
| 8,251,345 | B2 | 8/2012 | Inoue | |
| 8,714,523 | B2 * | 5/2014 | Lee | F16K 41/10 |
| | | | | 251/335.3 |
| 8,726,935 | B2 * | 5/2014 | Leys | B01F 15/0429 |
| | | | | 137/606 |
| 10,132,415 | B2 * | 11/2018 | Tanikawa | F16K 31/122 |
| 10,883,615 | B2 * | 1/2021 | Goto | F16K 31/1225 |
| 2006/0191777 | A1 * | 8/2006 | Glime | F16K 1/523 |
| | | | | 200/81 R |
| 2019/0009353 | A1 | 1/2019 | Watanabe et al. | |

OTHER PUBLICATIONS

U.S. Appl. No. 16/463,428 to Toshihide Yoshida et al., filed May 23, 2019.

* cited by examiner

[Fig. 1A]
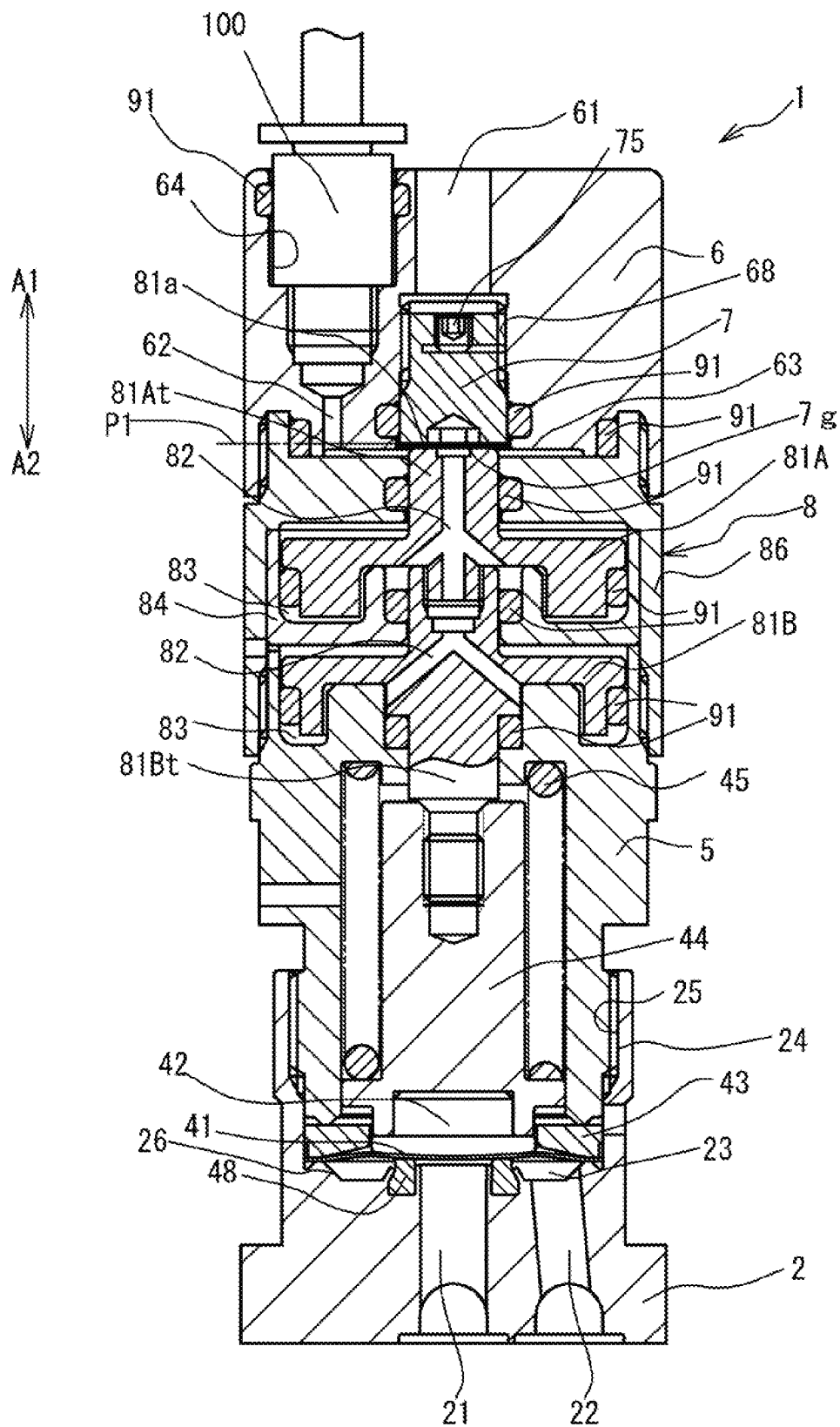

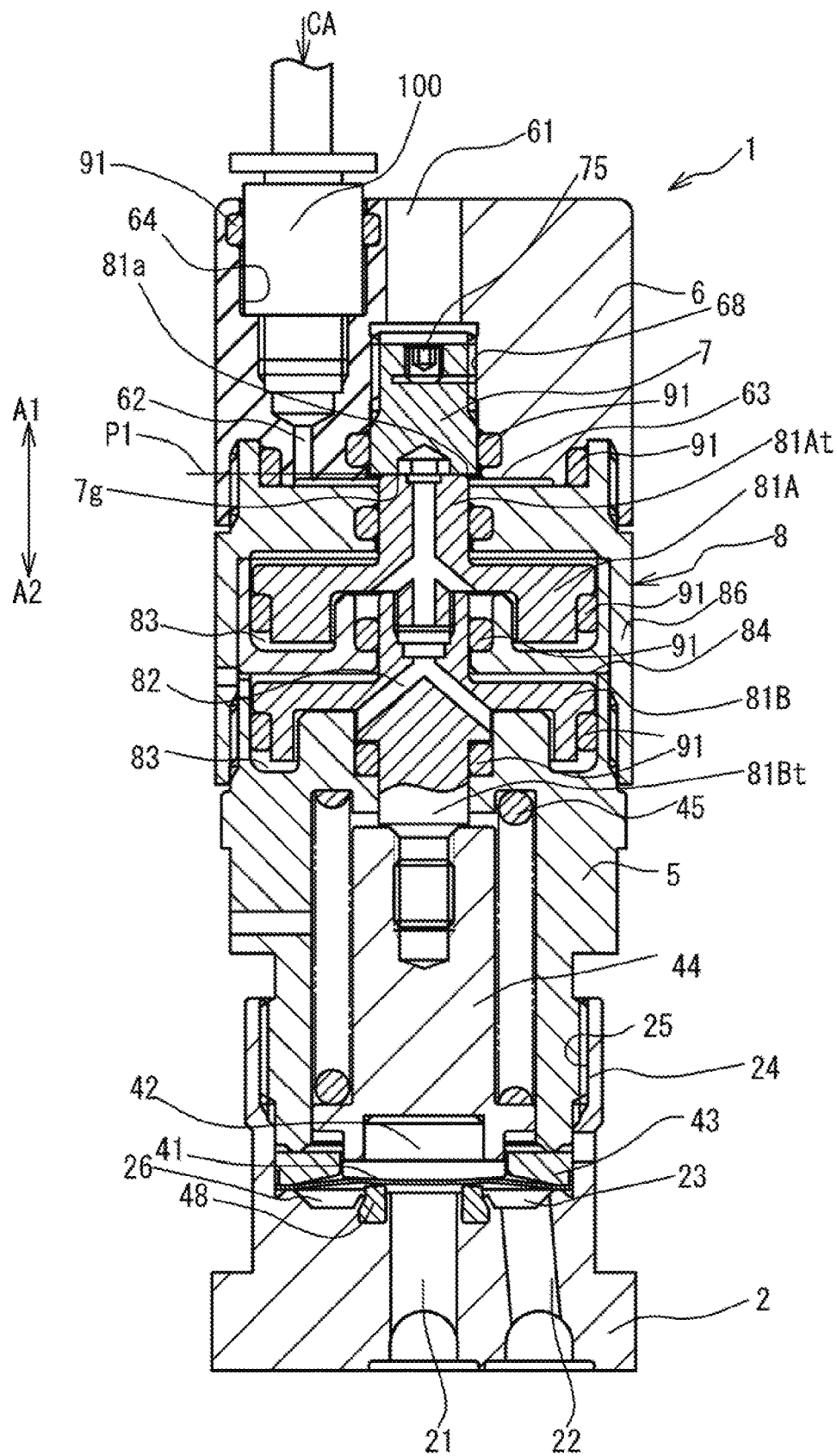
[Fig. 1B]

[fig. 2A]
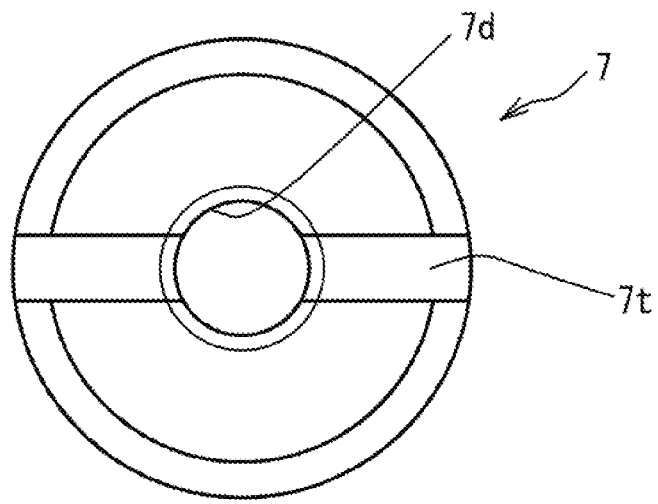
[Fig. 2B]
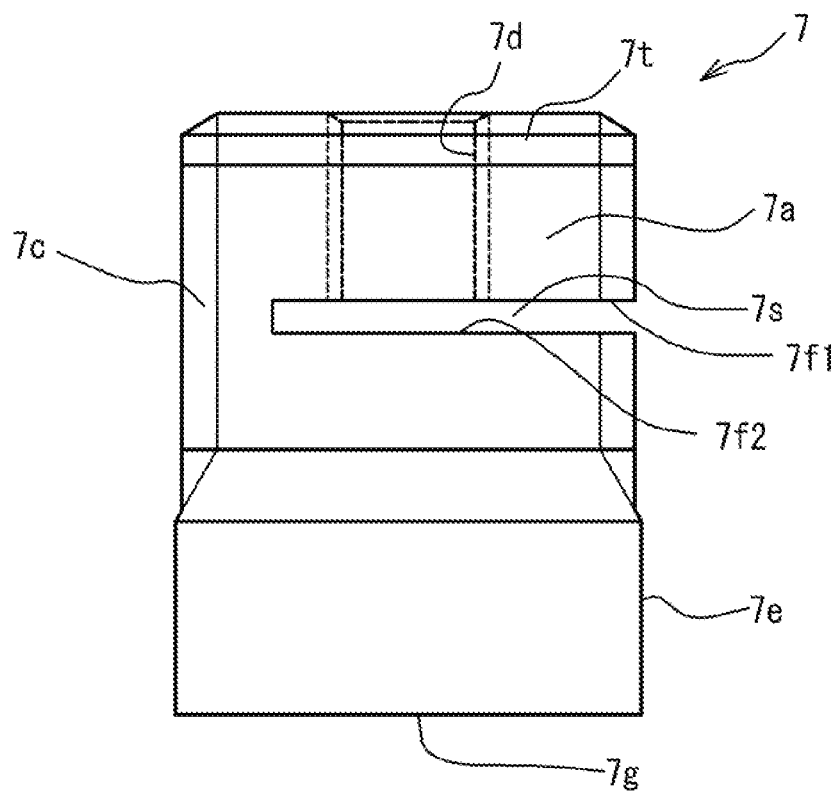

[Fig. 3A]
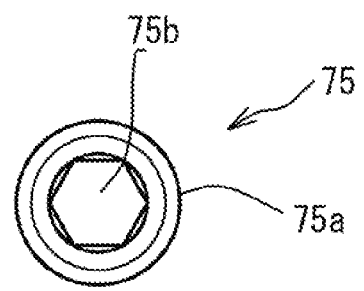
[Fig. 3B]
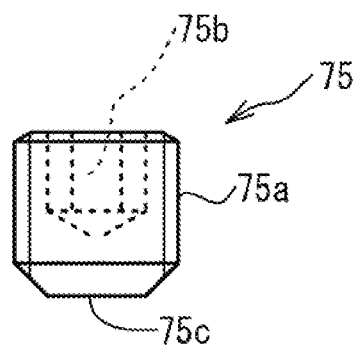

[Fig. 4A]
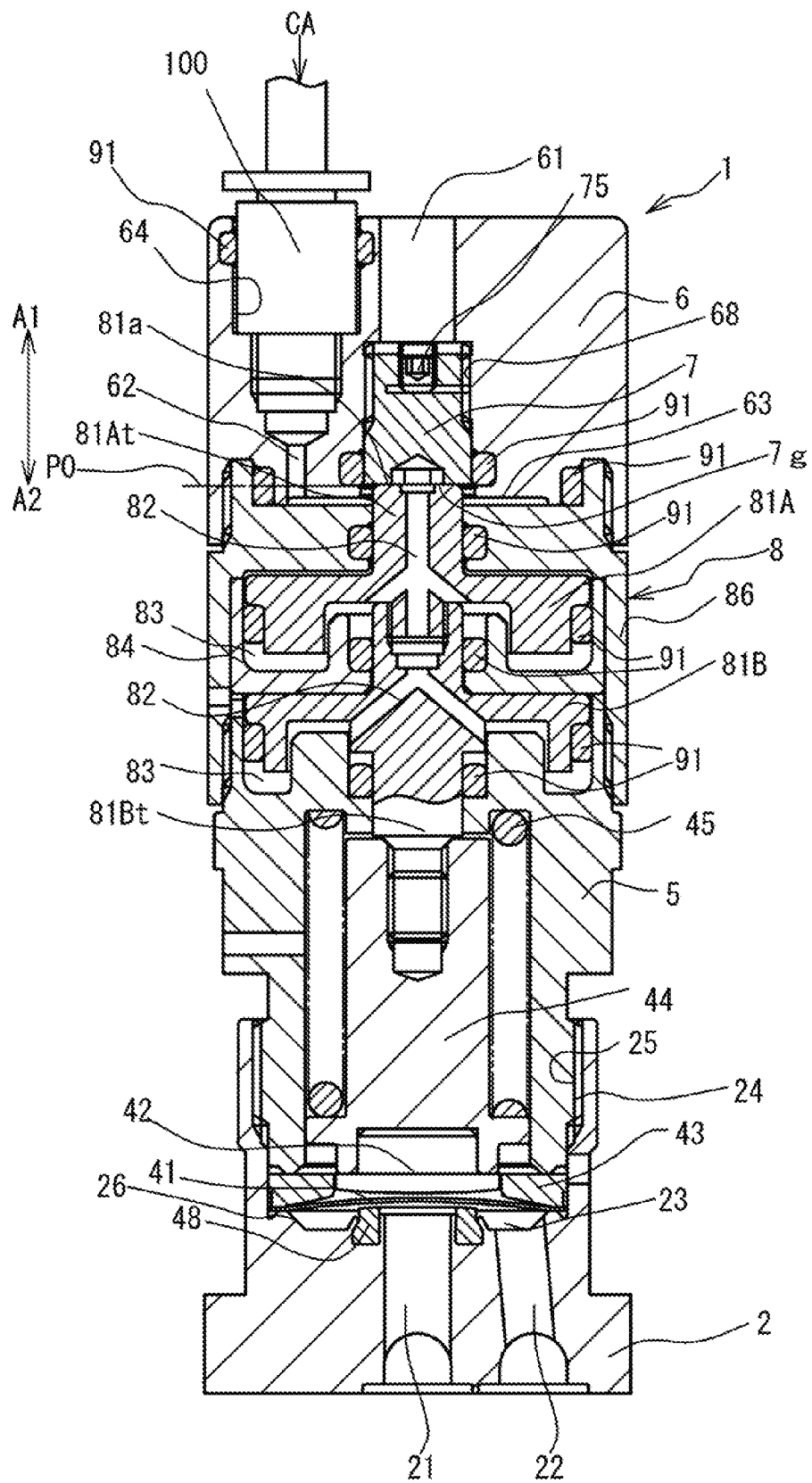

[Fig. 4B]
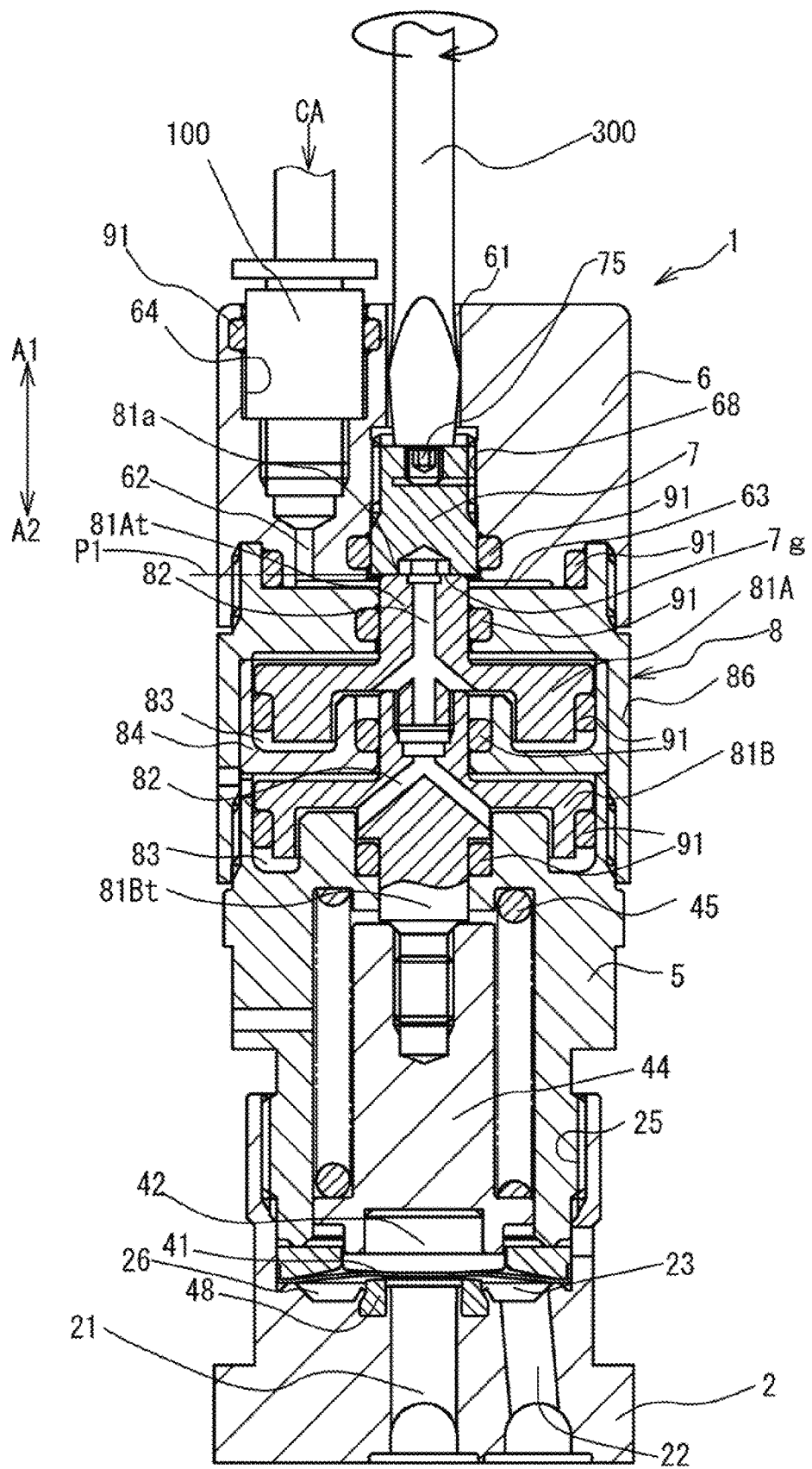

[Fig. 4C]
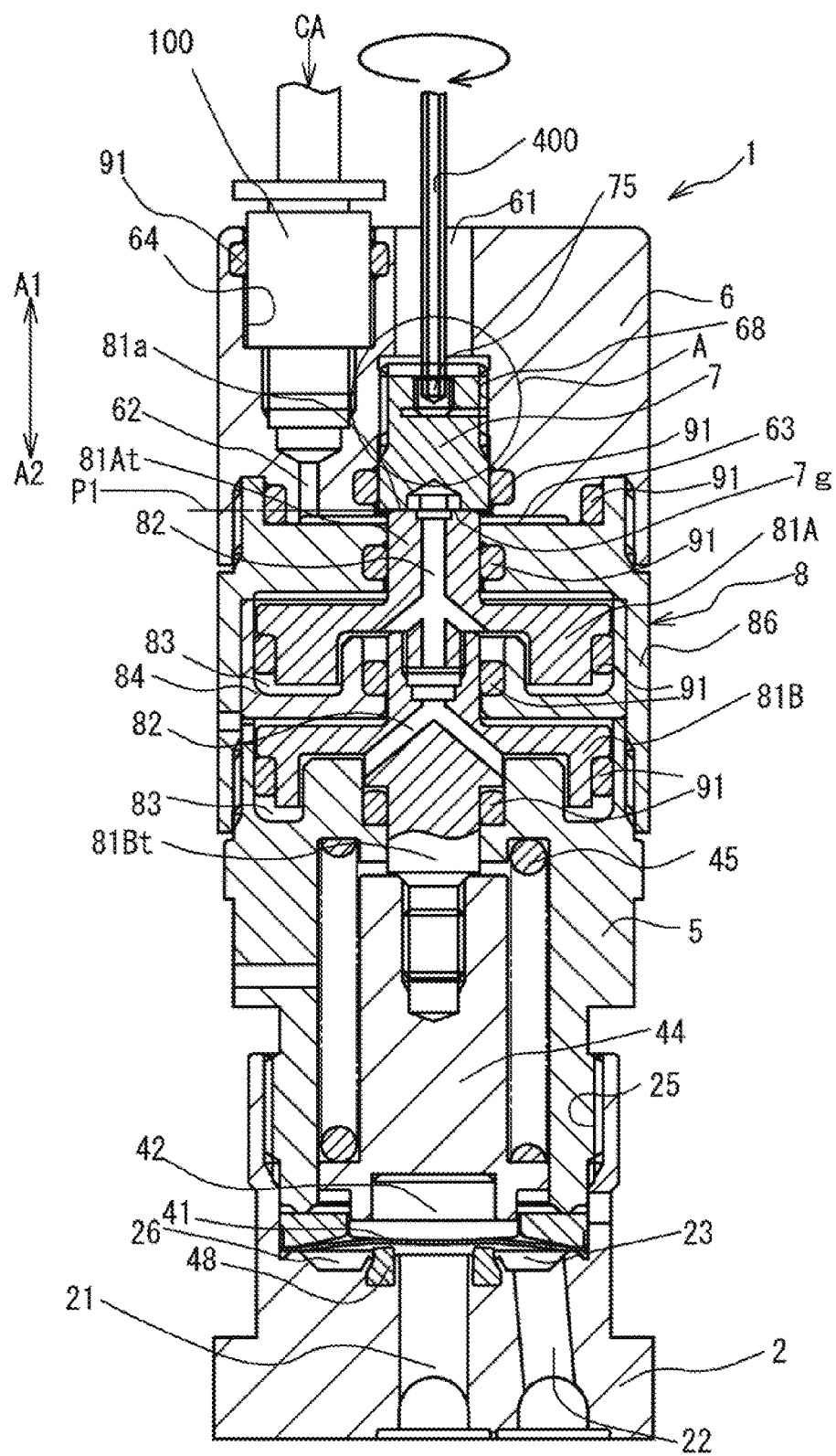

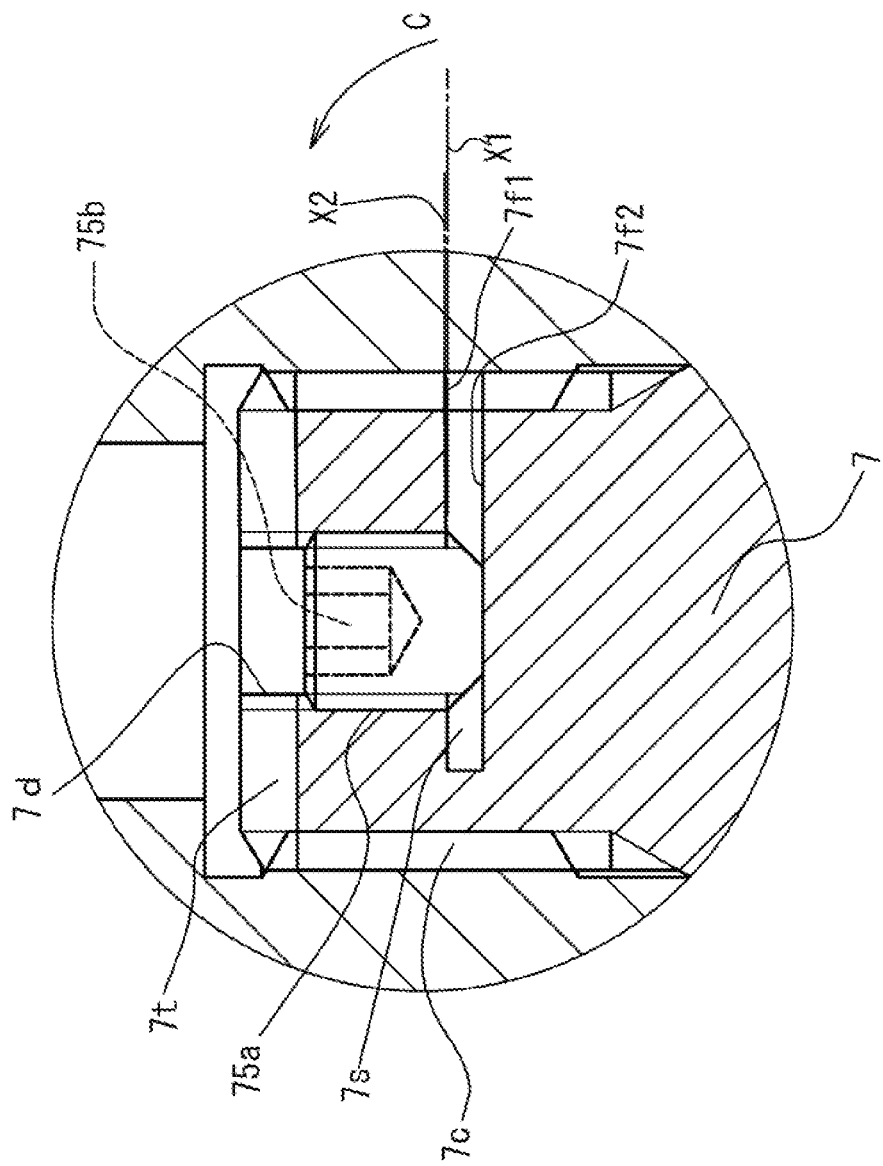
[Fig. 5]

[Fig. 6]
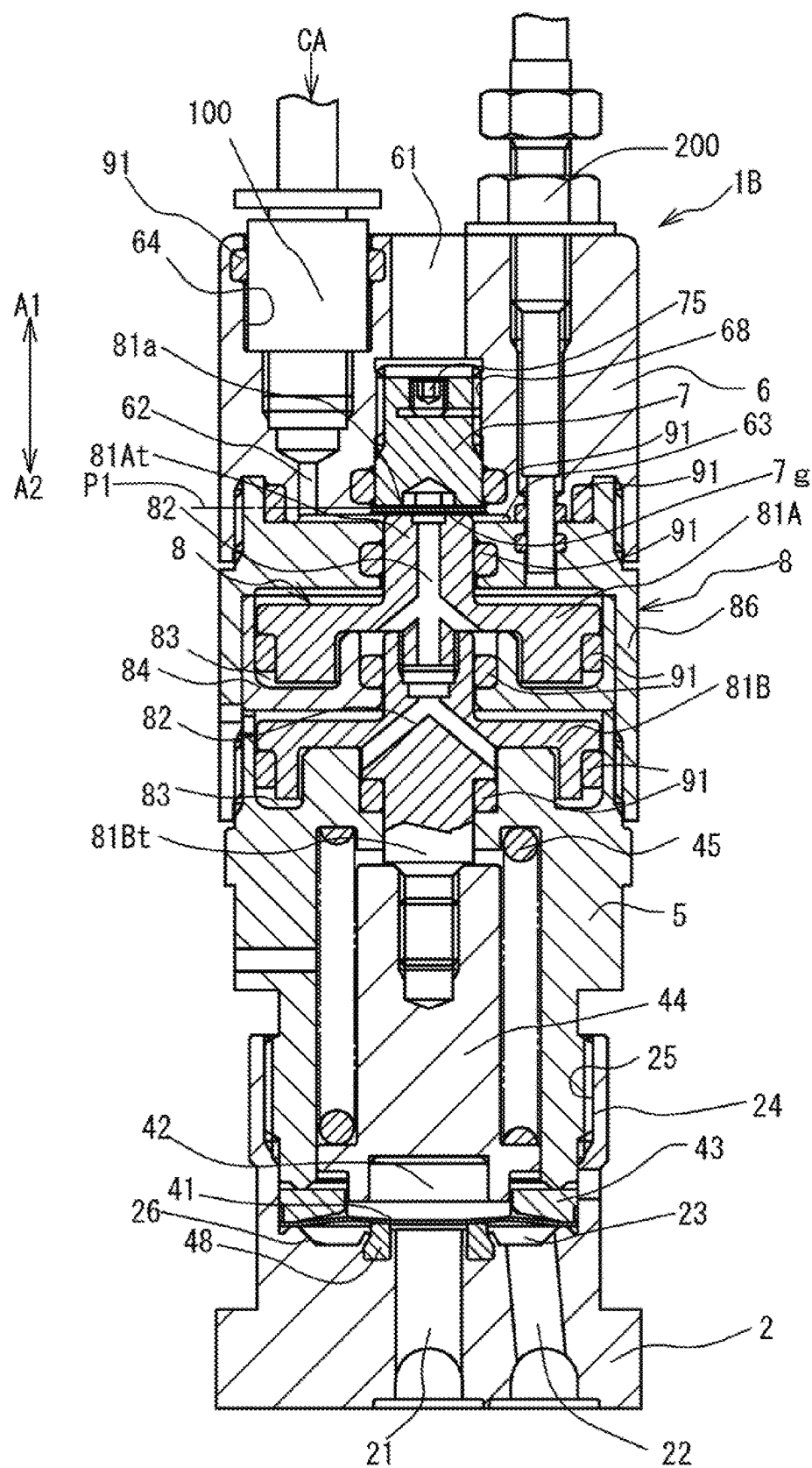

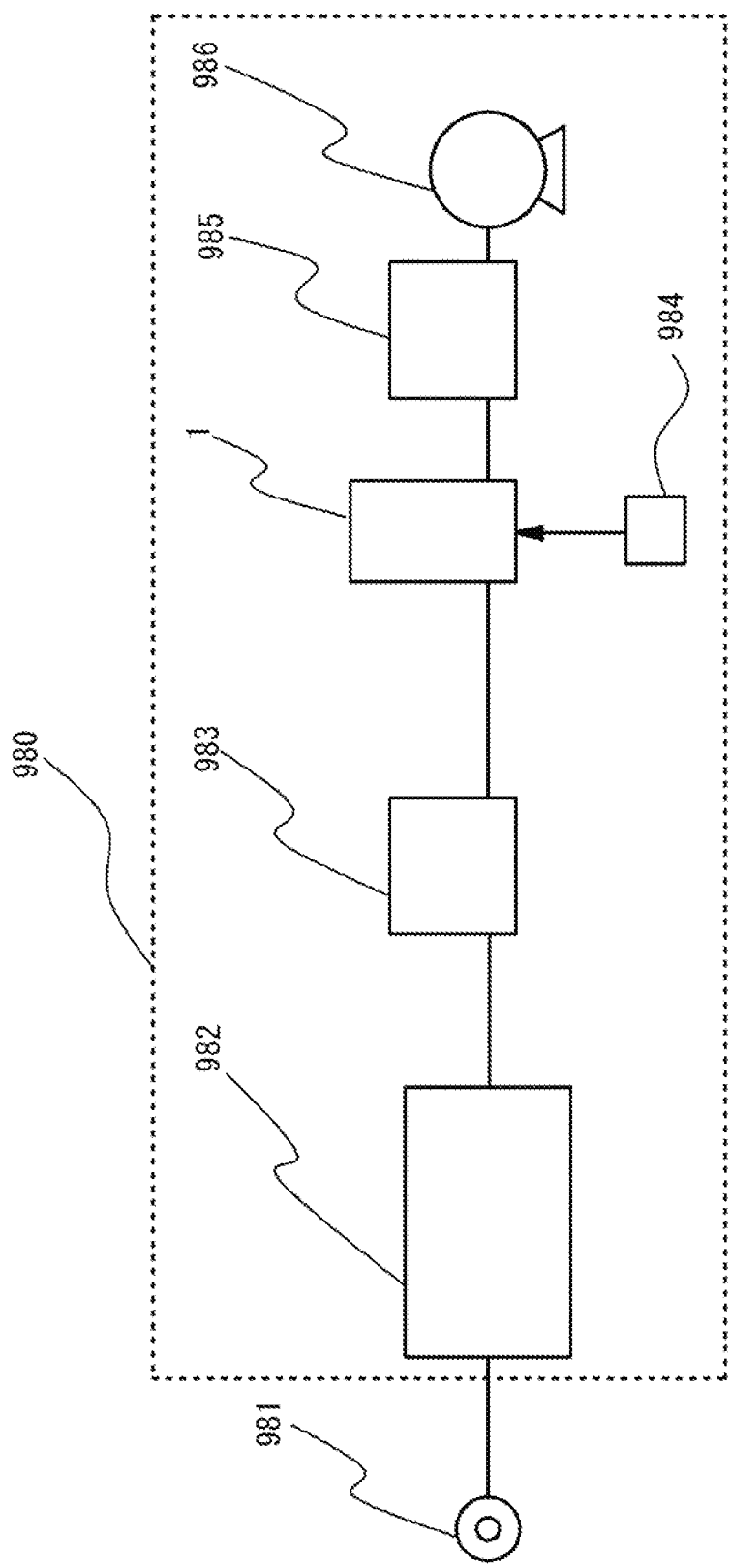

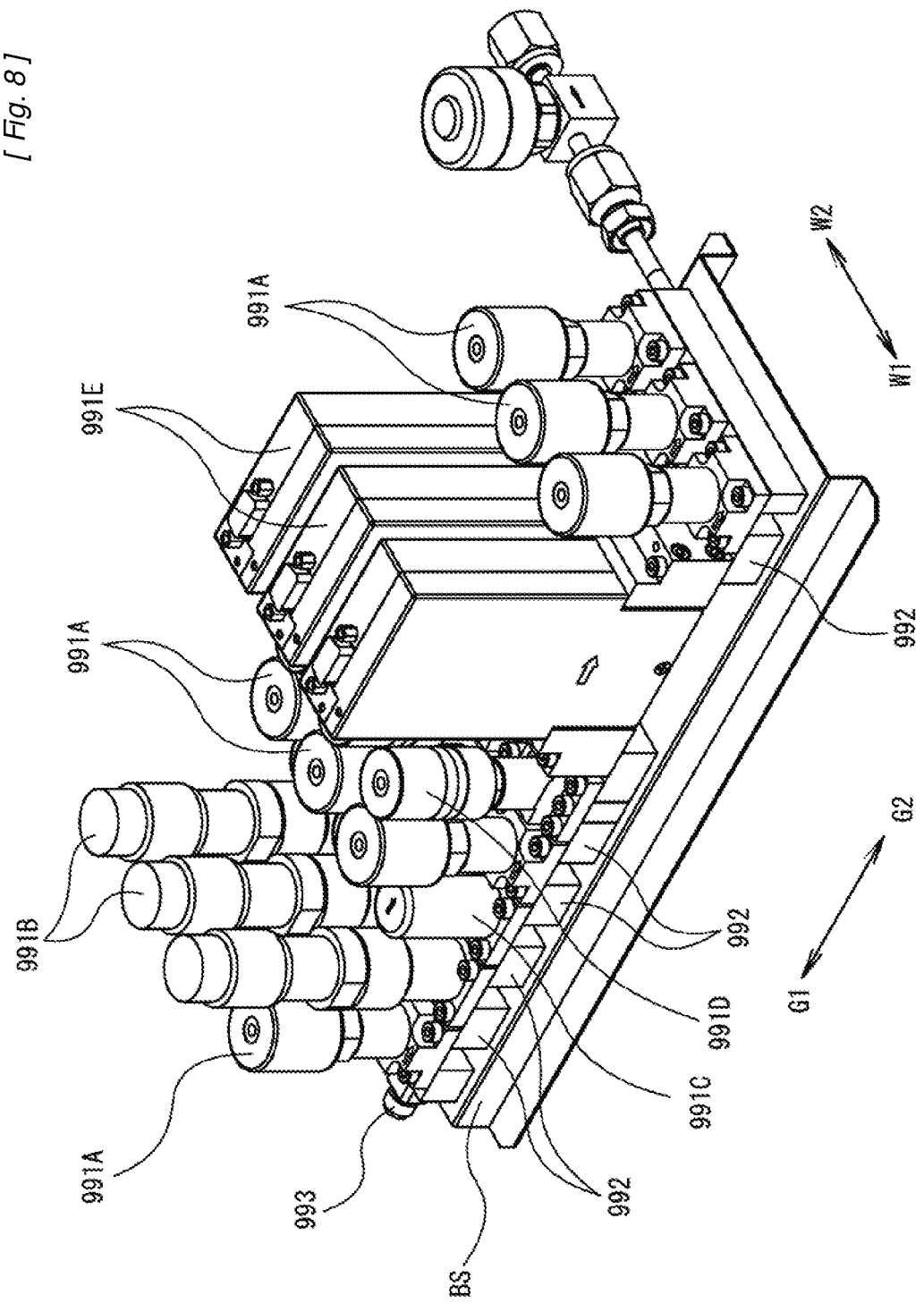

ACTUATOR AND VALVE DEVICE USING THE SAME

CROSS-REFERENCE TO RELATED APPLICATIONS

This application is based upon and claims the benefit of priority from the Japanese Patent Application No. 2018-143192, filed Jul. 31, 2018 the entire content of which is incorporated herein by reference.

FIELD OF THE INVENTION

The present invention relates to an actuator, a valve device that uses the actuator, a fluid control system, a fluid control method, a semiconductor manufacturing system, and a semiconductor manufacturing method.

DESCRIPTION OF THE BACKGROUND ART

In a semiconductor manufacturing process, for example, a valve device is used that controls a supply of various process gases to a chamber of a semiconductor manufacturing system.

In an atomic layer deposition (ALD) method, a flow rate of the process gas used in a treatment process that deposits a film on a substrate needs to be precisely adjusted and a certain amount of flow rate needs to be secured by increasing a size of a diameter of the substrate or the like.

In an air-driven valve, it is not easy to precisely adjust the flow rate by pneumatic adjustment or mechanical adjustment. Further, in a semiconductor manufacturing process based on the ALD method, the area around the processing chamber becomes high in temperature, and thus the valve is readily affected by temperature. Furthermore, the valve is opened and closed at high frequency, and thus readily ages and changes over time, requiring significant man-hours for the flow adjustment task.

PATENT DOCUMENTS

Patent Document 1: Japanese Laid-Open Patent Application No. 2006-519971
Patent Document 2: Japanese Laid-Open Patent Application No. 2010-043714

SUMMARY OF THE INVENTION

Problems to be Solved by the Invention

For example, in Patent Document 1 and Patent Document 2 there are disclosed techniques that allow adjustment of a stroke amount of a piston of an actuator of a valve device from outside the valve actuator.

Nevertheless, in the related art, it has been difficult to adjust the flow rate easily and precisely from outside the valve device while the valve device causes a gas such as a process gas to flow.

An object of the present invention is to provide a valve device capable of easily and precisely adjusting a flow rate of a flowing fluid, and an actuator used in the valve device.

Means for Solving the Problems

An actuator of the present invention includes:
a piston housed in a housing,
a supply port of a pressurized fluid provided to the housing, and
an adjustment member provided to the housing at a position separated from the supply port and including a regulating surface that regulates an upper limit position of possible movement of the piston, and
the piston or a member moving along with the piston comes into contact with the regulating surface of the adjustment member when the pressurized fluid is supplied through the supply port, and the piston is positioned in the upper limit position, and
the adjustment member is provided so as to allow adjustment of the upper limit position from outside the housing.

The adjustment member is provided so as to be directly accessible from outside the housing.

Preferably, the adjustment member includes a lock mechanism that is operable from outside the housing and locks a position of the adjustment member, and
the lock mechanism locks the position of the adjustment member by deforming the adjustment member screwed into the housing.

More preferably, the lock mechanism includes a threaded member that is operable from outside the housing, and is screwed into and deforms the adjustment member, and
a position of the adjustment member is finely adjusted by operating the threaded member while the position of the adjustment member is locked by the threaded member.

A valve device of the present invention includes:
a valve body that defines a flow path,
a valve element capable of opening and closing the flow path of the valve body,
an operation member that operates the valve element and is moveably provided between a closed position where the valve element closes the flow path and an open position where the valve element opens the flow path, set in advance, in opening and closing directions that allow the valve element to open and close the flow path, and
the actuator described above that is connected to the valve body at the housing and drives the operation member, and
the open position of the valve element is regulated in accordance with the upper limit position and adjusted by the adjustment member.

A flow adjustment method of the present invention is a flow adjustment method of the valve device described above, and includes the steps of:
raising the valve element to the open position while supplying a pressurized fluid to the actuator, and
adjusting the flow rate of a fluid flowing through the flow path of the valve body by operating the adjustment member.

A lift amount adjustment method of the present invention is a lift amount adjustment method of the valve device described above, and includes the step of:
adjusting a lift amount of the valve element from the closed position to the open position by the adjustment member with the valve element raised to the open position while supplying a pressurized fluid to the actuator.

A flow control method of the present invention includes the step of:
adjusting a flow rate of a fluid using the valve device described above.

A fluid control system of the present invention is a fluid control system including a plurality of fluid devices arranged from an upstream side toward a downstream side, each provided with the valve device described above.

A semiconductor manufacturing system of the present invention uses the valve device described above to control a process gas in a manufacturing process of a semiconductor device that requires a treatment process by the process gas in a sealed chamber.

A semiconductor manufacturing method of the present invention includes the step of using the valve device described above to control a flow rate of a process gas in a manufacturing process of a semiconductor device that requires a treatment process by the process gas in a sealed chamber.

Effect of the Invention

According to the present invention, a flow rate of a valve device can be easily adjusted with high precision.

BRIEF DESCRIPTION OF THE DRAWINGS

FIG. 1A is a longitudinal sectional view illustrating a closed state of a valve device according to an embodiment of the present invention.

FIG. 1B is a sectional view illustrating an open state after flow adjustment of the valve device in FIG. 1A.

FIG. 2A is a top view of an adjustment member.

FIG. 2B is a front view of the adjustment member.

FIG. 3A is a top view of a lock screw.

FIG. 3B is a front view of the lock screw.

FIG. 4A is a longitudinal sectional view of the valve device for explaining an example of a flow adjustment procedure of the valve device.

FIG. 4B is a longitudinal sectional view of the valve device for explaining a flow adjustment process following FIG. 4A.

FIG. 4C is a longitudinal sectional view of the valve device for explaining a lock process and a fine adjustment process of the adjustment member in continuation of FIG. 4B.

FIG. 5 is an enlarged sectional view of a circle A in FIG. 4C illustrating a state after lock completion of the adjustment member.

FIG. 6 is a longitudinal sectional view of a valve device according to another embodiment of the present invention.

FIG. 7 is a schematic diagram illustrating an example of applying the valve device according to an embodiment of the present invention to a semiconductor manufacturing process.

FIG. 8 is a perspective view illustrating an example of a fluid control system that uses the valve device of this embodiment.

DESCRIPTION OF THE PREFERRED EMBODIMENTS

Embodiments of this disclosure are described below with reference to the drawings. In the descriptions, the same elements are denoted using the same reference signs, and duplicate descriptions are omitted as appropriate.

First, an example of a fluid control system in which the present invention is applied will be described with reference to FIG. 8.

In the fluid control system illustrated in FIG. 8, there is provided a base plate BS made of metal, arranged in width directions W1, W2, and extending in longitudinal directions G1, G2. It should be noted that W1, W2, G1, and G2 denote rear side, front side, upstream side, and downstream side directions, respectively. In the base plate BS, various fluid devices 991A to 991E are installed via a plurality of flow path blocks 992, and flow paths (not illustrated) through which a fluid flows from the upstream side G1 toward the downstream side G2 are formed by the plurality of flow path blocks 992.

Here, "fluid device" is a device used in a fluid control system for controlling a flow of a fluid, comprising a body defining a fluid flow path, and provided with at least two flow path ports that open on a surface of this body. Specifically, the fluid device includes the switch valve (two-way valve) 991A, the regulator 991B, the pressure gauge 991C, the switch valve (three-way valve) 991D, the mass flow controller 991E, and the like, but is not necessarily limited thereto. It should be noted that an introducing pipe 993 is connected to each of the flow path ports on the upstream side of the flow paths (not illustrated) described above.

The present invention, while applicable to various valve devices such as the switch valves 991A, 991D, and the regulator 991B described above, will be described using a case of application to a switch valve as an example in this embodiment.

FIG. 1A is a sectional view illustrating a configuration of a valve device 1 in a closed state according to an embodiment of the present invention. FIG. 1B is a sectional view illustrating the closed state of the valve device 1 in FIG. 1A. As illustrated in FIGS. 1A and 1B, the valve device 1 includes a casing 6, a bonnet 5, a valve body 2, a valve seat 48, a diaphragm 41, a pressing adapter 43, a diaphragm presser 42, a pressing holder 44, a coil spring 45, an actuator 8, and an upper bulkhead 86. It should be noted that arrows A1, A2 in the drawing indicate upward and downward directions, A1 being the upward direction and A2 being the downward direction.

The valve body 2 is formed from stainless steel into a block shape, and forms a first flow path 21 and a second flow path 22. A cylindrical part 24 is formed on an upper part side of the valve body 2, and an inner circumference of the cylindrical part 24 is formed into a screw hole 25 that is screwed with the bonnet 5. The first flow path 21 is a flow path that opens on a bottom surface of the valve body 2 and a bottom surface of the cylindrical part 24, and the second flow path 22 is a flow path that opens on the bottom surface of the valve body 2 and the bottom surface of the cylindrical part 24.

The valve cent AR is disposed nn an opening periphery of the first flow path 21 of the bottom surface in the cylindrical part 24 of the valve body 2. The valve seat 48 may be made of a synthetic resin, such as perfluoroalkoxy alkane (PFA), polyamide (PA), polyimide (PI), polychlorotrifluoroethylene (PCTFE), or polytetrafluoroethylene (PTFE). The valve seat 48, while fixed to the valve body 2 by caulking, can also be disposed without caulking. An annular groove 23 is formed on the bottom surface of the cylindrical part 24, and this annular groove 23 and the second flow path 22 are interconnected.

The diaphragm 41 is supported at a peripheral edge part on a lower side by a support part 26 having a stepped shape and formed inside the cylindrical part 24 of the valve body 2, and the diaphragm 41 is fixed to the valve body 2 with the peripheral edge part on an upper side of the diaphragm 41 opposite to the support part 26 pressed in the downward direction A2 by the pressing adapter 43 having an annular shape. In this embodiment, the diaphragm 41 is obtained by swelling central parts of a thin plate made of a metal such as a special stainless steel, and a nickel and cobalt alloy thin plate upward, and thus has a spherical shell shape in which an upwardly convex arc shape is the natural state. The diaphragm 41 is formed in an elastically deformable manner into a spherical shell shape by a metal such as stainless or an NiCo-based alloy, or a fluorine-based resin, for example. The diaphragm 41 interconnects and blocks the first flow path 21 and the second flow path 22 by moving between a closed position of contact and an open position of non-contact with the valve seat 48.

The bonnet 5 is formed into a cylindrical shape, the outer peripheral surface on a lower end side of the bonnet 5 is screwed into the screw hole 25 of the valve body 2 to be connected to the valve body 2, and the lower end part of the bonnet 5 presses the pressing adapter 43 in the downward direction A2. It should be noted that a configuration in which the pressing adapter 43 is omitted and the peripheral edge part of the diaphragm 41 is pressed by the bonnet 5 is also possible.

In the interior of the bonnet 5, the pressing holder 44 serving as an operation member is pressed by the coil spring 45 in the downward direction A2 relative to the bonnet 5, that is, in the direction in which the diaphragm 41 is moved to the closed position. While the coil spring 45 is used in this embodiment, the present invention is not necessarily limited thereto, and other types of elastic members can be used, such as a disc spring or a leaf spring. The diaphragm presser 42 that is made of a synthetic resin such as polyimide and comes into contact with a center upper surface of the diaphragm 41 is mounted on a lower end surface of the pressing holder 44. The diaphragm presser 42 and the pressing holder 44 function as the operation member of the present invention.

The casing 6, the upper bulkhead 86 connected to the casing 6, the bonnet 5 connected to the upper bulkhead 86, and a lower bulkhead 84 sandwiched between the upper bulkhead 86 and the bonnet 5 form a housing of the actuator 8 that houses an upper piston 81A and a lower piston 81B.

The upper piston 81A is disposed in a cylinder 83 formed between the upper bulkhead 86 and the lower bulkhead 84, and the lower piston 81B is disposed in the cylinder 83 sandwiched between the bonnet 5 and the lower bulkhead 84.

A stem part 81Bt of the lower piston 81B is connected to the pressing holder 44.

Seal rings 91 are disposed and secure airtightness between the bonnet 5, the lower piston 81B, the lower bulkhead 84, the upper piston 81A, the upper bulkhead 86, and the casing 6. A thread part 68 is formed on a lower side of an access hole 61 opening at a central part of the casing 6, and an adjustment member 7 described later is screwed into this thread part. The seal ring 91 is disposed and secures airtightness between the adjustment member 7 and the access hole 61 of the casing 6.

A supply port 64 for supplying compressed air CA serving as the pressurized fluid is formed in a position separated from the access hole 61 on the upper part of the casing 6, the supply port 64 communicates with a flow path 62 formed in the casing 6, and the flow path 62 communicates with a flow path 63 formed between the casing 6 and the upper bulkhead 86. The supply port 64 and the access hole 61 are open on an upper surface which is a common surface of the casing 6. The flow path 63 communicates with a flow path 82 formed inside the upper piston 81A and the lower piston 81B. Here, the pressurized fluid is fluid pressurized by pressure sufficiently higher than atmospheric pressure, allowing the pistons to be driven against atmospheric pressure.

The cylinder 83, the upper piston 81A, and the lower piston 81B constitute the actuator 8 that moves the pressing holder 44 and the diaphragm presser 42 to the open position against the coil spring 45. The actuator 8 increases the area on which pressure acts by using the plurality of upper and lower pistons 81A, 81B, making it possible to boost the force resulting from the compressed air CA.

A so-called one-touch joint 100 is screwed into the supply port 64 of the casing 6, and the area between the one-touch joint 100 and the supply port 64 is sealed by the seal ring 91. The compressed air CA supplied through the one-touch joint 100 is supplied to the cylinder 83 between the upper piston 81A and the lower bulkhead 84 and to the cylinder 83 between the lower piston 81B and the bonnet 5 through the flow paths 62, 63, 82, and presses the upper piston 81A and the lower piston 81B in the upward direction A1. The upper piston 81A and the lower piston 81B are in contact with each other, and move in the upward and downward directions A1, A2 in coordination.

A contact surface 7g of the adjustment member 7, which is the lower end surface, is brought into contact with an upper end surface 81a of a stem part 81At of the upper piston 81A and regulates an upper limit position P1 of possible movement of the upper piston 81A. The contact surface 7g is formed in a direction orthogonal to the upward and downward directions A1, A2, which are the movement directions of the pistons. The upper limit position of possible movement of the lower piston 81B is also regulated in accordance with the upper limit position P1. Further, the lower limit positions of possible movement of the upper piston 81A and the lower piston 81B are determined in accordance with the position of the valve seat 48 since the actuator 8 is connected to the valve body 2.

That is, the lower limit positions of possible movement of the upper piston 81A and the lower piston 81B of the actuator 8 unit do not necessarily match those in a state in which the actuator 8 is assembled in the valve device 1.

The adjustment member 7, as illustrated enlarged in FIGS. 2A and 2B, is a columnar member made of a metal, and the area between a cylindrical surface 7e on a lower end side and the access hole 61 of the casing 6 is sealed by the seal ring 91. A thread part 7c is formed on an outer peripheral surface on an upper side of the cylindrical surface 7e of the adjustment member 7. In the middle of a region in a longitudinal direction of the adjustment member 7 where the thread part 7c is formed, a slit 7s is formed in a direction orthogonal to an axis line, and opposing surfaces 7f1, 7f2 opposing each other are defined. A screw hole 7d that passes through the opposing surface 7f1 of the slit 7s from the upper end surface is formed in the central part on an upper side of the slit 7s of the adjustment member 7. A lock screw 75 described later is screwed into the screw hole 7d. Furthermore, an engaging groove 7t in which a tip end part of a tool 300 described later is engaged is formed in the upper end surface of the adjustment member 7.

In the adjustment member 7, the slit 7s is formed in the middle of the region where the thread part 7c is formed, and thus an upper region 7a of the adjustment member 7 is supported in a cantilevered fashion. As described later, by elastically deforming a base portion of the upper region 7a by the lock screw 75, a relative positional relationship between the portion corresponding to the upper region 7a of the thread part 7c and the thread part 68 of the casing 6 is changed, and the adjustment member 7 is prevented from rotating relative to the thread part 68 of the casing 6. That is, the lock mechanism is configured, in which the lock screw 75 elastically deforms the cantilevered upper region 7a defined by the slit 7s of the adjustment member 7, to thereby inhibit the rotation of the adjustment member 7 relative to the thread part 68. It should be noted that the lock mechanism is not limited to this, and may be a mechanism capable of inhibiting the rotation of the adjustment member 7 relative to the thread part 68.

As illustrated in FIGS. 3A and 3B, the lock screw 75 is a so-called set screw, includes a thread part 75a on an outer peripheral surface, and forms a hexagonal hole 75b at the center of an upper end part.

FIG. 1A described above shows a state in which the supply of compressed air CA through the one-touch joint 100 is blocked, and the diaphragm 41 is in a state of being pressed against the valve seat 48 by the diaphragm presser 42. In this state, a gap is formed between the contact surface 7g of the adjustment member 7 positioned at the upper limit position P1 and the upper end surface 81a of the stem part 81At of the upper piston 81A. The size of the gap corresponds to a predetermined lift amount from a closed position where the diaphragm 41 is in contact with the valve seat 48 to an open position where the diaphragm 41 is separated from the valve seat 48.

As illustrated in FIG. 1B, when the compressed air CA is supplied through the one-touch joint 100, the upper piston 81A and the lower piston 81B are driven in the upward direction A1, and the diaphragm presser 42 and the pressing holder 44 are pulled upward by the actuator 8 against a pressing force of the coil spring 45. The movement of the upper piston 81A in the upward direction A1 is restricted at the upper limit position P1 as the upper end surface 81a of the upper piston 81A comes into contact with the contact surface 7g of the adjustment member 7. In this state, the diaphragm 41 is raised from the valve seat 48 by a predetermined lift amount. That is, the predetermined lift amount is determined in accordance with the upper limit position P1. Therefore, by adjusting the upper limit position P1, it is possible to adjust the lift amount of the diaphragm 41 as well as the flow rate of the valve device 1.

Next, an example of the flow adjustment method and the lift amount adjustment method of the valve device 1 will be described with reference to FIG. 4A to FIG. 4C.

The valve device 1 illustrated in FIG. 4A is in a state in which the upper limit position is not adjusted by the adjustment member 7. The position of the contact surface 7g of the adjustment member 7 at this time is given as an initial upper limit position P0. When the compressed air CA is supplied through the one-touch joint 100, the upper piston 81A and the lower piston 81B are driven in the upward direction A1, and the movement of the upper piston 81A is restricted at the initial upper limit position P0. In addition, although not illustrated, a fluid such as nitrogen gas is caused to flow from the first flow path 21 to the second flow path 22 and the flow rate is monitored using a flowmeter not illustrated.

Next, the tool 300 configured by a flathead screwdriver is inserted into the access hole 61 of the casing 6 and engaged with the engaging groove 7t of the adjustment member 7, and the adjustment member 7 is rotated to move in the downward direction A2. When the adjustment member 7 is moved in the downward direction A2, the lift amount of the diaphragm 41 also decreases, the flow rate of the gas being monitored decreases, and the adjustment member 7 is rotated until it approaches a target flow rate When the flow rate of the gas being monitored reaches the target flow rate, the operation of the adjustment member 7 is stopped.

Next, as illustrated in FIG. 4C, instead of the tool 300, a tool 400 configured by a hexagonal wrench is fitted to the hexagonal hole 75b of the lock screw 75 through the access hole 61, and the lock screw 75 is rotated to move toward the opposing surface 7f2. As illustrated in FIG. 5, as the lock screw 75 is rotated, a lower end surface 75c of the lock screw 75 presses the opposing surface 7f2 downward, causing a reaction force from the opposing surface 7f2 to act as a bending force on the lock screw 75, that is, on the upper region 7a of the adjustment member 7. Given a plane including the opposing surface 7f1 in a state in which bending force is not applied to the upper region 7a as a reference plane X1, the reference plane X1 becomes a plane X2 inclined in an arrow C direction when the bending force is applied to the upper region 7a. For example, when an inclination angle of the plane X2 relative to the reference plane X1 exceeds a predetermined angle, the adjustment member 7 is locked. Here, the locked state refers to a state in which the rotational position of the adjustment member 7 does not change or does not substantially change even when the upper end surface 81a of the upper piston 81A repeatedly collides with the contact surface 7g of the adjustment member 7.

Fine Adjustment by Lock Screw

As described above, when the force acting on the adjustment member 7 of the lock screw 75 exceeds a certain degree of force, the adjustment member 7 is locked.

In this locked state, when the lock screw 75 is operated, the adjustment member 7 is subjected to slight elastic deformation. Utilizing the slight elastic deformation, after the adjustment member 7 is locked by the lock screw 75, fine adjustment of the flow rate or fine adjustment of the lift amount is possible by further operating the lock screw 75.

Another example of the flow adjustment method and the lift amount adjustment method will now be described.

In a valve device 1B illustrated in FIG. 6, a position sensor 200 capable of detecting the positions of the upper piston 81A in the upward and downward directions A1, A2 without contact is provided to the casing 6. The other components of the valve device 1B are the same as those of the valve device 1 described above.

While, as described using FIG. 4A, first the compressed air CA is supplied through the one-touch joint 100, it is not necessary to introduce the gas into the flow paths 21, 22.

In this state, the adjustment member 7 is adjusted while monitoring the detection value of the position sensor 200. When the position of the upper piston 81A in the upward and downward directions reaches the target position, that is, the position corresponding to the target lift amount, the adjustment member 7 is completely adjusted and locked by the lock screw 75.

According to such a method, it is not necessary to introduce actual gas, making it possible to more easily implement the adjustment task.

Next, an application example of the valve device 1 described above will be described with reference to FIG. 7.

A semiconductor manufacturing system 980 illustrated in FIG. 7 is a system for executing a semiconductor manufacturing process by the ALD method, with 981 denoting a process gas supply source, 982 denoting a gas box, 983 denoting a tank, 984 denoting a control unit, 985 denoting a processing chamber, and 986 denoting an exhaust pump.

In the semiconductor manufacturing process based on the ALD method, the flow rate of the process gas needs to be precisely adjusted and a certain amount of flow rate needs to be secured by increasing a size of a diameter of the substrate.

The gas box 982 is an integrated gas system (a fluid control system) in which various fluid control devices, such as a switch valve, a regulator, and a mass flow controller, are integrated and housed in a box to supply an accurately measured process gas to the processing chamber 985.

The tank 983 functions as a buffer for temporarily storing the process gas supplied from the gas box 982.

The control unit 984 controls flow adjustment by controlling the supply of the operation gas to the valve device 1.

The processing chamber 985 provides a sealed treatment space for forming a film on the substrate by the ALD method.

The exhaust pump 986 draws a vacuum inside the processing chamber 985.

It should be noted that the present invention is not limited to the aforementioned embodiments. Those skilled in the art can make various additions and modifications within the scope of the present invention. For example, while a case where the valve device 1 is used in a semiconductor manufacturing process based on the ALD method is illustrated in the above-described application example, the present invention is not necessarily limited thereto, and can be applied to various targets that require precise flow adjustment, such as an atomic layer etching (ALE) method, for example.

While a piston built into a cylinder activated by gas pressure is used as the actuator in the above-described embodiment, the present invention is not necessarily limited thereto, and optimal actuators can be variously selected in accordance with the control target.

While, in the configuration of the above-described embodiment, the valve device 1 is disposed outside the gas box 982 serving as a fluid control system, the valve device 1 of the above-described embodiment can also be included in fluid control system that integrates and houses various fluid devices such as a switch valve, a regulator, and a mass flow controller in a box.

While the valve device is mounted on the plurality of flow path blocks 992 as a fluid control system illustrated in the above-described embodiment, in addition to the divided-type flow path block 992, the valve device of the present invention can also be applied to an integrated flow path block and a base plate.

Although a case in which the piston and the stem of the actuator are integrally formed has been described as an example in the above-described embodiment, in a type of actuator in which the piston and the stem are separately formed and both the piston and the stem move when pressurized fluid such as compressed gas is supplied, the upper limit position of the piston can be regulated by the adjustment member coming into contact with the stem instead of the piston.

DESCRIPTIONS OF REFERENCE NUMERALS 1, 1B: Valve device
2: Valve body
5: Bonnet
6: Casing
7: Adjustment member
7a: Upper region
7c: Thread part
7d: Screw hole
7e: Cylindrical surface
7f1: Opposing surface
7f2: Opposing surface
7g: Contact surface (Regulating surface)
7s: Slit
7t: Engaging groove
8: Actuator
21: First flow path
22: Second flow path
23: Annular groove
24: Cylindrical part
25: Screw hole
26: Support part
41: Diaphragm
42: Diaphragm presser
43: Pressing adapter
44: Pressing holder
45: Coil spring
48: Valve seat
61: Access hole
62: Flow path
63: Flow path
64: Supply port
68: Thread part
75: Lock screw
75b: Hexagonal hole
75a: Thread part
75c: Lower end surface
81A: Upper piston
81At: Stem part
81B: Lower piston
81Bt: Stem part
81a: Upper end surface
82: Flow path
83: Cylinder
84: Lower bulkhead
86: Upper bulkhead
91: Seal ring
100: One-touch joint
200: Position sensor
300: Tool
400: Tool
980: Semiconductor manufacturing system
982: Gas box
983: Tank
984: Control unit
985: Processing chamber
986: Exhaust pump
991A to 991E: Fluid device
992: Flow path block
993: Introducing pipe
A: Circle
A1: Upward direction
A2: Downward direction
BS: Base plate
C1: Arrow
CA: Compressed air
G1: Longitudinal direction upstream side
G2: Longitudinal direction downstream side
P0: Initial upper limit position
P1: Upper limit position
R: Reaction force
W1: Width direction
W2: Width direction
X1: Reference plane
X2: Plane

What is claimed is:

1. An actuator comprising:
a piston housed in a housing;
a supply port of a pressurized fluid provided to the housing; and
a piston adjuster provided to the housing at a position separated from the supply port and including a regulating surface that regulates an upper limit position of possible movement of the piston, wherein
the piston or a structure that moves along with the piston comes into contact with the regulating surface of the piston adjuster when the pressurized fluid is supplied through the supply port, and the piston is positioned in the upper limit position, the piston adjuster is provided so as to allow adjustment of the upper limit position from outside the housing, the piston adjuster comprises a lock that is operable from outside the housing and locks a position of the piston adjuster, and the lock locks a position of the piston adjuster by deforming the piston adjuster screwed into the housing.

2. The actuator according to claim 1, wherein the piston adjuster is provided so as to be directly accessible from outside the housing.

3. The actuator according to claim 1, wherein the lock comprises a threaded structure that is operable from outside the housing, is screwed into and adjusts the piston adjuster, and a position of the piston adjuster is finely adjusted by operating the threaded structure while the position of the piston adjuster is locked by the threaded structure.

4. The actuator according to claim 1, wherein the supply port and an access hole to access the piston adjuster are provided on a common surface of the housing.

5. A valve device comprising:
a valve body that defines a flow path;
a valve element to open and close the flow path of the valve body;
a valve operator that operates the valve element and is moveably provided between a closed position where the valve element closes the flow path and an open position where the valve element opens the flow path, set in advance, in opening and closing directions that allow the valve element to open and close the flow path; and
the actuator as defined in claim 1 that is connected to the valve body at the housing and drives the valve operator, wherein the open position of the valve element is regulated in accordance with the upper limit position and adjusted by the piston adjuster.

6. A flow adjustment method of the valve device as defined in claim 5, comprising:
raising the valve element to the open position while supplying a pressurized fluid to the actuator; and
adjusting the flow rate of a fluid flowing through the flow path of the valve body by operating the piston adjuster.

7. A lift amount adjustment method of the valve device as defined in claim 5, comprising:
adjusting a lift amount of the valve element from the closed position to the open position by the piston adjuster with the valve element raised to the open position while supplying a pressurized fluid to the actuator.

8. A flow control method comprising:
adjusting a flow rate of a fluid using the valve device as defined in claim 5.

9. A fluid control system comprising:
a plurality of fluid devices arranged from an upstream side toward a downstream side, each provided with the valve device as defined in claim 5.

10. A semiconductor manufacturing system that uses the valve device as defined in claim 5 to control a process gas in a manufacturing process of a semiconductor device that requires a treatment process by the process gas in a sealed chamber.

11. A semiconductor manufacturing method comprising:
using the valve device as defined in claim 5 to control a flow rate of a process gas in a manufacturing process of a semiconductor device that requires a treatment process by the process gas in a sealed chamber.

12. The actuator according to claim 1, wherein the piston adjuster includes a columnar body including a slit disposed transverse to an axial direction of the columnar body, and the slit is provided so that an upper region of the columnar body is cantilever supported.

* * * * *